(12) United States Patent  (10) Patent No.: US 6,323,670 B1
Lee  (45) Date of Patent: Nov. 27, 2001

(54) PCB ADAPTER FOR IC CHIP FAILURE ANALYSIS

(75) Inventor: Chung Lee, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/247,975

(22) Filed: Feb. 11, 1999

(51) Int. Cl.[7] .............................. G01R 31/02; G01R 31/26
(52) U.S. Cl. ........................ 324/765; 324/755; 324/757
(58) Field of Search ................................ 324/765, 755, 324/500, 757; 439/73, 350

(56) References Cited

U.S. PATENT DOCUMENTS

| | | | | |
|---|---|---|---|---|
| 3,870,953 | * | 3/1975 | Boatman et al. | 324/72.5 |
| 4,312,117 | * | 1/1982 | Robillard et al. | 438/107 |
| 4,695,112 | * | 9/1987 | Maston et al. | 439/350 |
| 5,481,203 | | 1/1996 | Appold | 324/755 |
| 5,495,179 | * | 2/1996 | Wood et al. | 324/755 |
| 5,519,332 | | 5/1996 | Wood et al. | 324/755 |
| 5,674,785 | | 10/1997 | Akram et al. | 437/217 |
| 5,739,050 | | 4/1998 | Farnworth | 438/15 |
| 5,781,021 | | 7/1998 | Ilani | 324/754 |
| 5,825,171 | * | 10/1998 | Shin | 324/73.1 |
| 5,946,791 | * | 9/1999 | Baldwin | 29/593 |
| 6,072,323 | * | 6/2000 | Hembree et al. | 324/755 |

* cited by examiner

Primary Examiner—Safet Metjahic
Assistant Examiner—Anjan K Deb
(74) Attorney, Agent, or Firm—George O. Saile; Stephen B. Ackerman

(57) ABSTRACT

An arrangement that allows convenient and cost effective mounting of semiconductor die during the process of semiconductor failure analysis. The die that is analyzed can be biased and electrical stimuli and stimuli response signals can be provided to and extracted form the die. The arrangement of the present invention imposes no restriction on the type and size of die that can be analyzed and does not require equipment modification costs other than the cost of the subject mounting arrangement. The die to be analyzed is to be mounted with the die backside facing the die-mounting platform, an optional opening in the die-mounting platform allows backside analysis of the die. A method for complete, reliable and quick analysis of integrated circuit chips.

39 Claims, 2 Drawing Sheets

PCB ADAPTER FOR IC CHIP FAILURE ANALYSIS

FIELD OF THE INVENTION

This invention relates to the field of testing semiconductor circuits, and more specifically to apparatus and methods for failure analysis of packaged integrated circuits.

DESCRIPTION OF THE PRIOR ART

Integrated circuits are commonly packaged in a package configuration referred to as a quad flat package (QFP). In this type of package, the leads are very thin, flat metal conductors. These metal conductors extend outward from the four sidewalls of the flat rectangular package. Inoperative QFP devices are frequently returned to a device analysis department as allegedly defective parts, further testing and failure analysis of the device is to be performed by the device analysis organization. The returned QFP devices are often returned with damaged leads because the device user has performed incoming inspection and in-situ testing. As part of this testing, the devices may have been mounted on a circuit board of a test system. The individual integrated circuit devices may also have been soldered on a circuit board for testing of the device as part of testing the functionality of the entire circuit board.

When an integrated-circuit device is suspected of being defective, the device is removed from the circuit board by desoldering. During this desoldering, the leads of the device may be damaged. This kind of damage to the leads may prevent the integrated circuit device from being tested and may prevent verification that the device was actually defective.

Defective devices must be analyzed and retested to determine the cause of the defect. If the device leads have been damaged, it may be very difficult or even impossible to perform the necessary testing and failure analysis. In addition, other questions about the device cannot be investigated and answered, questions such as how, where, and why the device failed.

Finally, if the leads of the device have been damaged, it is very likely that the most significant aspect of failure analysis cannot be performed, that is, determining the root cause of the failure.

One Prior Art technique for dealing with damaged QFP leads is to manually solder test-lead wires to the damaged (very thin) leads of the QFP. These test-leads establish electrical contact with the leads of the defective device. This soldering operation is difficult to perform with larger packages that may have more than 100 leads. The poor success rate for manually soldering a test-lead wire to a damaged device lead indicates that a better, more efficient technique is needed to allow the retesting of damaged QFP devices.

U.S. Pat. No. 5,481,203 (Appold) shows an adapter for a back failure analysis socket.

U.S. Pat. No. 5,781,021 (Ilani) shows universal fixtureless test equipment.

U.S. Pat. No. 5,674,785 (Farnworth) displays an apparatus for assembling semiconductor package for testing.

U.S. Pat. No. 5,519,332 (Wood et al.) shows a carrier for die testing.

SUMMARY OF THE INVENTION

The principle objective of the present invention is to reduce the time and expense required in preparing or positioning a packaged IC for failure analysis.

Another objective of the present invention is to reduce the number of wire jumpers and switches required to prepare or position a packaged IC for failure analysis.

Another objective of the present invention is to allow for ease of preparing or positioning for failure analysis of IC packages of non-uniform or different sizes.

Another objective of the present invention is to allow backside access to packaged IC's for failure analysis.

Another objective of the present invention is to facilitate the feeding of electrical power and electrical signal stimuli to the packaged IC during failure analysis.

According to the present invention, a Printed Circuit Board (PCB) assembly is provided for mounting an Integrated Circuit (IC) during failure analysis of the IC. The PCB assembly includes a clamping arrangement for holding or clamping the PCB board while test signals and power is supplied to the IC via this clamp. Jumper wires connect the IC to the leads provided on the surface of the PCB, an opening in the PCB allows for backside failure analysis of the IC. The location of this opening is such that access is provided to the back of the IC.

The first embodiment of the present invention provides a Printed Circuit Board assembly onto which a chip or die that is to be analyzed is mounted and that provides for the supply of electrical power and electrical stimuli signals to the chip or die to be analyzed. The chip or die that is to be analyzed is mounted on the printed circuit board with the backside or ball contact side facing upwards, that is facing the printed circuit board. The plastic mould into which the die is mounted is removed down to the level of the die. Electrical jumper wires establish connections between the top of the die and electrical leads mounted on the surface of the PCB.

The second embodiment of the present invention provides a Printed Circuit Board assembly onto which a chip or die that is to be analyzed is mounted and that provides for the supply of electrical power and electrical stimuli signals to the chip or die to be analyzed while at the same time providing for an opening or cut-out within the PCB assembly that is lined up with the chip to be analyzed such that backside analysis on this chip or die can be performed. Under the second embodiment of the present invention the chip or die that is to be analyzed is mounted on the printed circuit board with the backside or ball contact side facing toward the printed circuit board.

DETAILED DESCRIPTION OF THE PREFERRED EMBODIMENT

Figure 1:
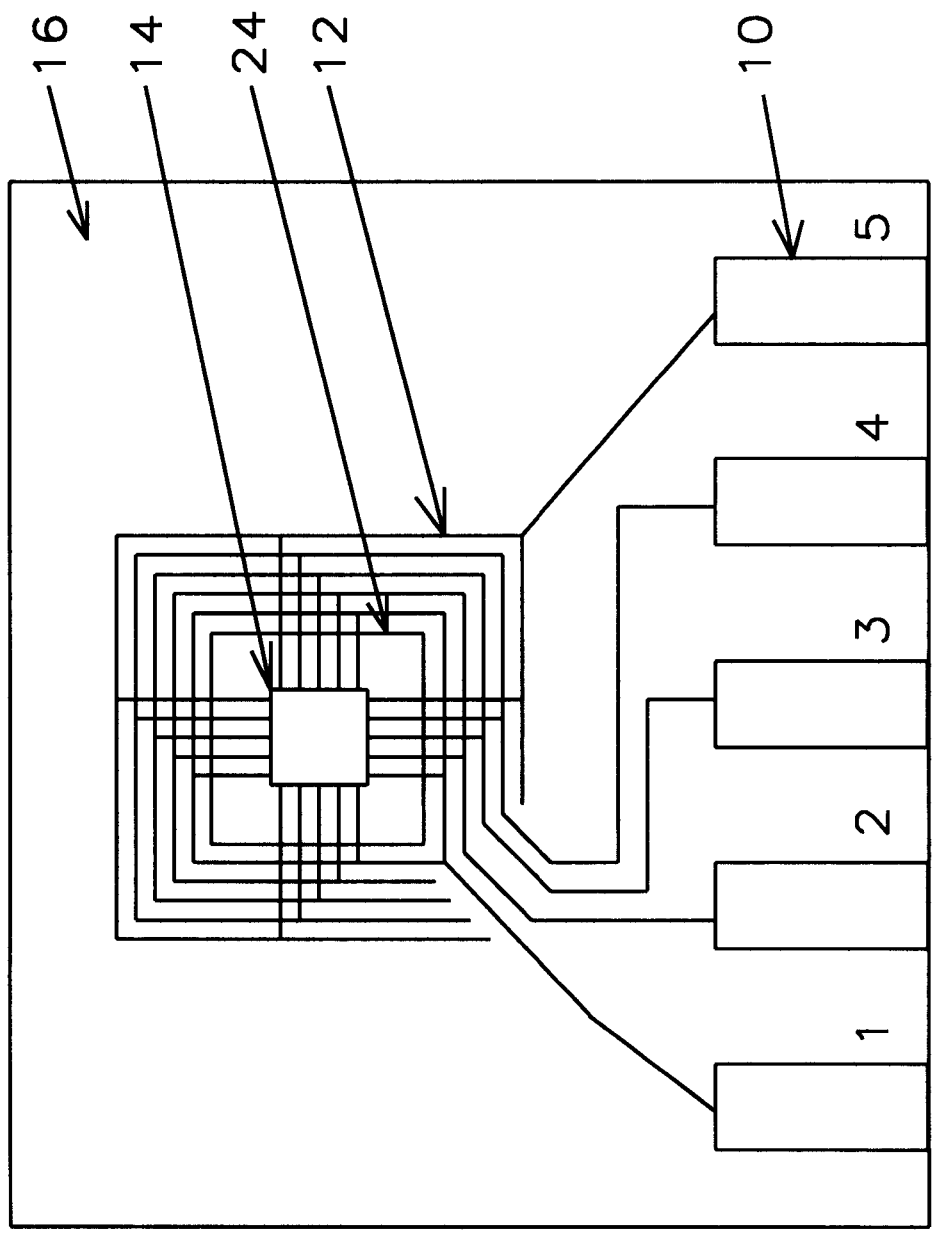
FIG. 1 shows a top view of the PCB.

Referring now more specifically to FIG. 1, there is shown a top view of the PCB assembly 16 of the present invention. The pads 10, numbered 1 through 5, are the contact points that connect to a clamping arrangement (see FIG. 2). These pads 10 form the electrical entry point to the PCB 16 in that power and signal lines, which are needed to stimulate the die or chip that is being analyzed, are connected to these pads 10. The PCB wiring 12, which runs on the surface of the PCB 16, connect the pads 10 with the area surrounding the die or chip that is mounted in area 14. The semiconductor die to be analyzed is mounted on top of the PCB within area 14.

A square opening or cut-out in the PCB can be provided in area 24, the die that is to be analyzed is mounted on top of the PCB with the backside of the die in the plane of or facing the top surface of the PCB. This mounting of the die can be accomplished in a number of ways; the die can for instance be mounted on glass where the glass mounting is inserted within the cut out in area 24 of the PCB. The number of pads 10 shown in FIG. 1 can be any number and does not have to be limited to five pads. The printed circuit board wires 12 shown in FIG. 1 can be of a configuration as required by a particular failure analysis assemblage.

Figure 2:
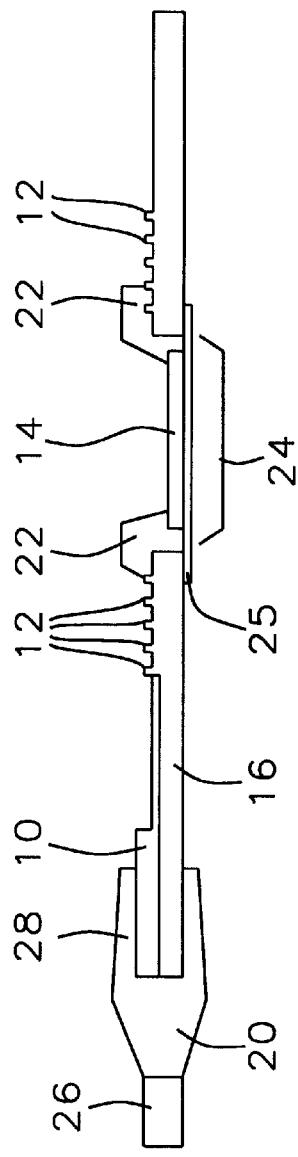
FIG. 2 shows a cross sectional view of the PCB assembly.

Referring now to FIG. 2, there is shown a cross section of the PCB assembly 16 with the addition of a clamping arrangement 20. Power and signal lines are connected to clamp 20 by external (not shown) power supplies and test equipment. These power and signal lines enter clamp 20 at the extremity 26 of clamp 20 and are further extended through clamp 20 to make electrical contact with contact points 10 (FIG. 1). The internal arrangement of the wire assembly of power and signal lines within clamp 20 are not specific to the failure analysis assembly of the invention but must be provided so that electrical signals can be provided to the device that is analyzed using the chip failure analysis assembly of the invention. For many failure analysis conditions only DC electrical power will be supplied by means of the clamp 20 while electrical stimuli and response signals are handled directly at the chip or die interface. The extremity 26 of the clamping arrangement 20, which is opposite to the side 28 of the claming arrangement 20, is connected to and interfaces with electrical power supplies and/or electrical stimuli or electrical stimuli response analysis circuitry. Electrical power supplies are needed to bias or provide power to the die that is being analyzed while the electrical stimuli and stimuli response circuitry can be part of the die analysis procedure.

From the cross section of the PCB shown in FIG. 2 it is clear that the die that is to be analyzed can be analyzed either from the top of the die or from the back of the die. Topside analysis of the die is first highlighted.

If the analysis is performed by electrically accessing the die from the top, the package in which the die has been mounted, if any, is removed down to the level of the top surface of the die. This removal process can be a mechanical or a chemical process, polishing operations may also be required in order to completely clean the top surface of the die of any impurities. Once electrical contact can be made with the top side of the die, the die is electrically connected to the printed circuit leads 12 on top of the PCB by means of jumper wires 22 that are soldered in place between the top of the die and wires 12. It is clear that the die can in this way be stimulated with electrical signals that are provided by means of the clamp/signal arrangement 20.

For backside analysis of the die, the die is mounted into the PCB in the same manner as the previously highlighted mounting for topside analysis. Access to the die is, for backside analysis, provided though an opening in the PCB within the area 24. This does not limit the scope of the analysis that can be performed by accessing the die from the backside since access points on the backside of the die are, in most cases, of a macro nature where access points to the die on the top side are of a considerably smaller physical nature. For Ball Grid Array devices, for instance, sections of the ball grid need to be removed by, for instance, the process of mechanical grinding. The ball grid access points are, by their very nature, major access or exit points within the die, which makes device analysis from the backside feasible. The die can, as one alternative, be mounted on a glass plate 25.

Figure 3:
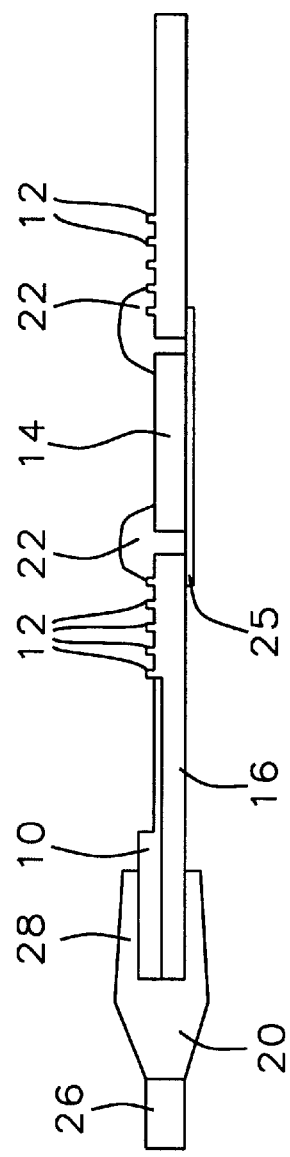
FIG. 3 shows mounting of the die on a glass plate.

FIG. 3 further highlights this approach. It must be pointed out that the present invention mostly addresses analysis procedures that emphasize DC analysis as opposed to AC analysis. AC analysis requires, by its very nature, special probe cards and a considerable number of signals provided to the die to be tested. The present invention will also find application in analysis procedures that required a limited number of DC stimulus voltages, this number being approximately 6. In many of the devices that need to be analyzed, it is important to analyze electrical "hot spots", that is areas where electrical shorts or other conditions of current crowding occur. The present invention greatly facilitates the mechanical handling of the semiconductor die for such testing environments.

Figure 4:
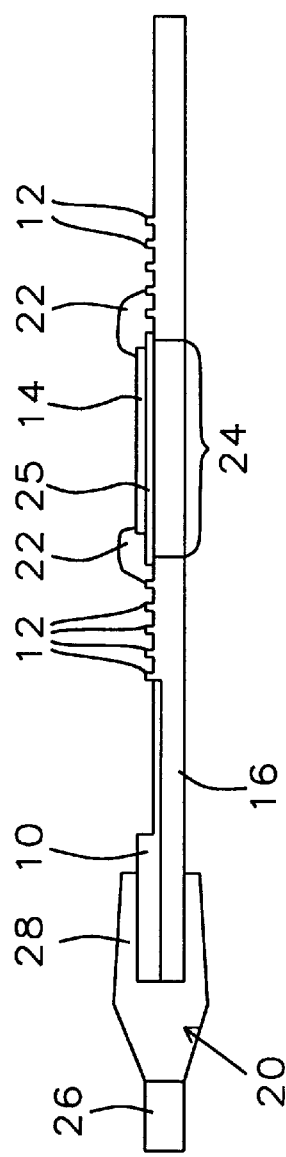
FIG. 4 shows a mounting of a semiconductor die on the upper surface of PCB 16 of the invention.

FIG. 4 shows a cross section where the area for mounting a semiconductor die is above the surface of PCB 16. Glass plate 25 overlies the surface of PCB 16 and is centered with respect to cut-out 24, the semiconductor die is mounted as shown in area 14 of FIG. 4. Bond wires 22 again establish contact between the semiconductor die that is mounted in location 14 and the PCB wiring 12 that is provided on the surface of PCB 26.

The foregoing descriptions of the specific embodiment of the present invention have been provided for purposes of illustration and description. They are not intended to be exclusive or to limit the invention to the precise forms disclosed, a number of modifications and variations may be possible in light of the above teachings. The embodiments were chosen and described to best explain the principle of the invention and its practical application, to thereby enable others skilled in the art to best utilize the present invention and various embodiments with various modifications as are suited to a particular use being contemplated. It is intended that the scope of the invention be defined by the claims appended hereto and by their equivalents.

What is claimed is:

1. A chip failure analysis assembly for mounting and performing failure analysis of an integrated circuit die having a plurality of leads, said failure analysis assembly comprising:

a printed circuit board;

a location or position on top of said printed circuit board for mounting said semiconductor die that is to be analyzed, a die that is to be analyzed being mounted on the surface of a printed circuit board with a backside of the die in a plane of the surface of the printed circuit board, the die that is to be analyzed being mounted on a glass surface where the glass surface is inserted in a cut out provided in the printed circuit board;

a clamping arrangement for said printed circuit board;

an electrical interface of said clamping arrangement with electrical power supplies or electrical stimulus or electrical response analysis apparatus;

a means for distributing electrical signals from said clamping arrangement to said location of said die to be examined;

contact points between said clamping arrangement and said means for distributing electrical signals; and a means for establishing electrical connections between said means for distributing electrical signals and said die to be analyzed, said means comprising jumper wires.

2. The failure analysis assembly of claim 1, said clamping arrangement comprising a wire assembly of a plurality of electrical wires for connecting said electrical stimuli or stimuli response apparatus with said contact points.

3. The failure analysis assembly of claim 2, said electrical wire assembly providing power to said contact points for biasing said die during said analysis.

4. The failure analysis assembly of claim 2, said electrical wire assembly providing electrical stimulus signals to said contact points for functionally activating said die during said analysis.

5. The failure analysis assembly of claim 2, said electrical wire assembly providing electrical stimulus response wiring from said contact points to said electrical interface for functionally analyzing electrical response signals during said analysis of said die.

6. The failure analysis assembly of claim 2, said electrical wire assembly providing a multiplicity of power, electrical stimuli and electrical stimuli response wires to the device to be analyzed for biasing and analyzing said die during said analysis.

7. The failure analysis assembly of claim 1, said contact points comprising a multiplicity of electrical contacting pads.

8. The failure analysis assembly of claim 1, said means for distributing electrical signals from said clamping arrangement to said location for mounting said die to be analyzed comprising a multiplicity of printed circuit board wires.

9. The failure analysis assembly of claim 8, said printed circuit board wires having electrical power or direct current supply carrying characteristics.

10. The failure analysis assembly of claim 8, said printed circuit board wires having electrical stimulus/response signal or high frequency electrical signal carrying characteristics.

11. The failure analysis assembly of claim 8, said printed circuit board wires having a multiplicity of power or direct current supply and electrical stimulus/response or high frequency carrying characteristics.

12. The failure analysis assembly of claim 1, said jumper wires having power or direct current carrying characteristics.

13. The failure analysis assembly of claim 1, said jumper wires having alternating current or high frequency carrying characteristics.

14. A chip failure analysis assembly for mounting and performing failure analysis of an integrated circuit die having a plurality of leads, said failure analysis assembly comprising:
   a printed circuit board;
   a location or position on top of said printed circuit board for mounting the semiconductor die that is to be analyzed;
   an opening within said circuit board which is aligned with and directly below said location or position on top of said printed circuit board for mounting the semiconductor die to be analyzed for back side analysis of said die, a die that is to be analyzed being mounted on a surface of the printed circuit board with a backside of the die in a plane of the surface of the printed circuit board, the die that is to be analyzed being mounted on a glass surface where the glass surface is inserted in the opening provided in the printed circuit board;
   a clamping arrangement for said printed circuit board;
   an electrical interface of said clamping arrangement with electrical power supplies or electrical stimulus or electrical response analysis apparatus;
   a means for distributing electrical signals from said clamping arrangement to the die to be analyzed;
   contact points between said clamping arrangement and said means for distributing electrical signals; and
   a means for establishing electrical connections between said means for distributing electrical signals and said die to be analyzed, said means comprising jumper wires.

15. The failure analysis assembly of claim 14, said clamping arrangement comprising a wire assembly of a plurality of electrical wires for establishing electrical analysis conditions for said die to be analyzed.

16. The failure analysis assembly of claim 15, said electrical wire assembly providing power to said contact points for biasing said die during said analysis.

17. The failure analysis assembly of claim 15, said electrical wire assembly providing electrical stimulus signals to said contact points for functionally activating said die during said analysis.

18. The failure analysis assembly of claim 15, said electrical wire assembly providing electrical stimulus response wiring from said contact points to said electrical interface for functionally analyzing electrical response signals during said analysis of said die.

19. The failure analysis assembly of claim 15, said electrical wire assembly providing a multiplicity of power, electrical stimuli and electrical stimuli response wires for the device to be analyzed for biasing and analyzing said die during said analysis.

20. The failure analysis assembly of claim 14, said contact points comprising a multiplicity of pads.

21. The failure analysis assembly of claim 14, said means for establishing electrical contact between said contact points and said location for mounting the die to be analyzed comprising a multiplicity of printed board wires.

22. The failure analysis assembly of claim 21, said multiplicity of printed board wires having electrical power or direct current supply carrying characteristics.

23. The failure analysis assembly of claim 21, said multiplicity of printed board wires having power or electrical stimulus/response signal or high frequency electrical signal carrying characteristics.

24. The failure analysis assembly of claim 21, said multiplicity of printed board wires having a multiplicity of power or direct current supply and electrical stimulus/response or high frequency carrying characteristics.

25. The failure analysis assembly of claim 14, said jumper wires having power or direct current carrying characteristics.

26. The failure analysis assembly of claim 14, said jumper wires having alternating current or high frequency carrying characteristics.

27. A method for performing semiconductor chip failure analysis, comprising:
   providing a failure analysis assembly, said failure analysis assembly comprising a printed circuit board, further comprising a location or position on top of said printed circuit board for mounting said semiconductor die that is to be analyzed, further comprising a clamping arrangement for said printed circuit board, further comprising an electrical interface of said clamping arrangement with electrical power supplies or electrical stimulus or electrical response analysis apparatus, further comprising a means for distributing electrical signals from said clamping arrangement to said location of said die to be examined, further comprising contact points between said clamping arrangement and said means for distributing electrical signals and further comprising bond wires for establishing electrical connections between said means for distributing electrical signals and said die to be analyzed;

mounting a die that is to be analyzed on the surface of the printed circuit board with a backside of the die in a plane of the surface of the printed circuit board, the die being mounted on a glass surface, the glass surface being inserted in an opening provided in the printed circuit board;

providing electrical stimulus signals to said semiconductor chip; and performing said semiconductor chip failure analysis.

28. The method of claim 27, said clamping arrangement comprising a wire assembly of a plurality of electrical wires for connecting said electrical stimuli or stimuli response apparatus with said contact points.

29. The method of claim 28, said electrical wire assembly providing power to said contact points for biasing said die during said analysis.

30. The method of claim 28, said electrical wire assembly providing electrical stimulus signals to said contact points for functionally activating said die during said analysis.

31. The method of claim 28, said electrical wire assembly providing electrical stimulus response wiring from said contact points to said electrical interface for functionally analyzing electrical response signals during said analysis of said die.

32. The method of claim 28, said electrical wire assembly providing a multiplicity of power, electrical stimuli and electrical stimuli response wires to the device to be analyzed for biasing and analyzing said die during said analysis.

33. The method of claim 27, said contact points comprising a multiplicity of electrical contacting pads.

34. The method of claim 27, said means for distributing electrical signals from said clamping arrangement to said location for mounting said die to be analyzed comprising a multiplicity of printed circuit board wires.

35. The method of claim 34, said printed circuit board wires comprising electrical power or direct current supply carrying characteristics.

36. The method of claim 34, said printed circuit board wires comprising electrical stimulus/response signal or high frequency electrical signal carrying characteristics.

37. The method of claim 34, said printed circuit board wires comprising a multiplicity of power or direct current supply and electrical stimulus/response or high frequency carrying characteristics.

38. The method of claim 27, said jumper wires having power or direct current carrying characteristics.

39. The method of claim 38, said jumper wires having alternating current or high frequency carrying characteristics.

* * * * *